United States Patent [19]

Berwin

[11] Patent Number: 4,954,757
[45] Date of Patent: Sep. 4, 1990

[54] LINEAR DEFLECTION AMPLIFIER WITH ENERGY RECOVERY

[75] Inventor: Ted W. Berwin, Playa del Rey, Calif.
[73] Assignee: Hughes Aircraft Company, Los Angeles, Calif.
[21] Appl. No.: 263,459
[22] Filed: Oct. 27, 1988
[51] Int. Cl.$^5$ .................... H01J 29/70; H01J 29/76
[52] U.S. Cl. .................... 315/403; 315/408
[58] Field of Search ........ 315/378, 403, 406, 408–410, 315/387, 389

[56] References Cited

U.S. PATENT DOCUMENTS

| | | | |
|---|---|---|---|
| 3,914,654 | 10/1975 | Cooksey | 315/408 |
| 3,983,452 | 9/1976 | Bazin | 315/397 |
| 4,581,564 | 4/1986 | Gassler | 315/403 |
| 4,642,533 | 2/1987 | Carpenter | 315/408 |

*Primary Examiner*—Gregory C. Issing
*Attorney, Agent, or Firm*—Leonard A. Alkov; Wanda K. Denson-Low

[57] ABSTRACT

Disclosed herein is a linear deflection amplifier which is suitable for processing horizontal sweep signals for driving a magnetic deflection yoke of a radar CRT PPI (Plan Position Indicator) display. The amplifier features a transadmittance feedback where output current follows input voltage. Flyback resonance is derived by a shunt capacitor coupled to an FET switch. Low crossover distortion and temperature compensation of components within the system is achieved by use of a modified class B power MOSFET push-pull configuration.

5 Claims, 3 Drawing Sheets

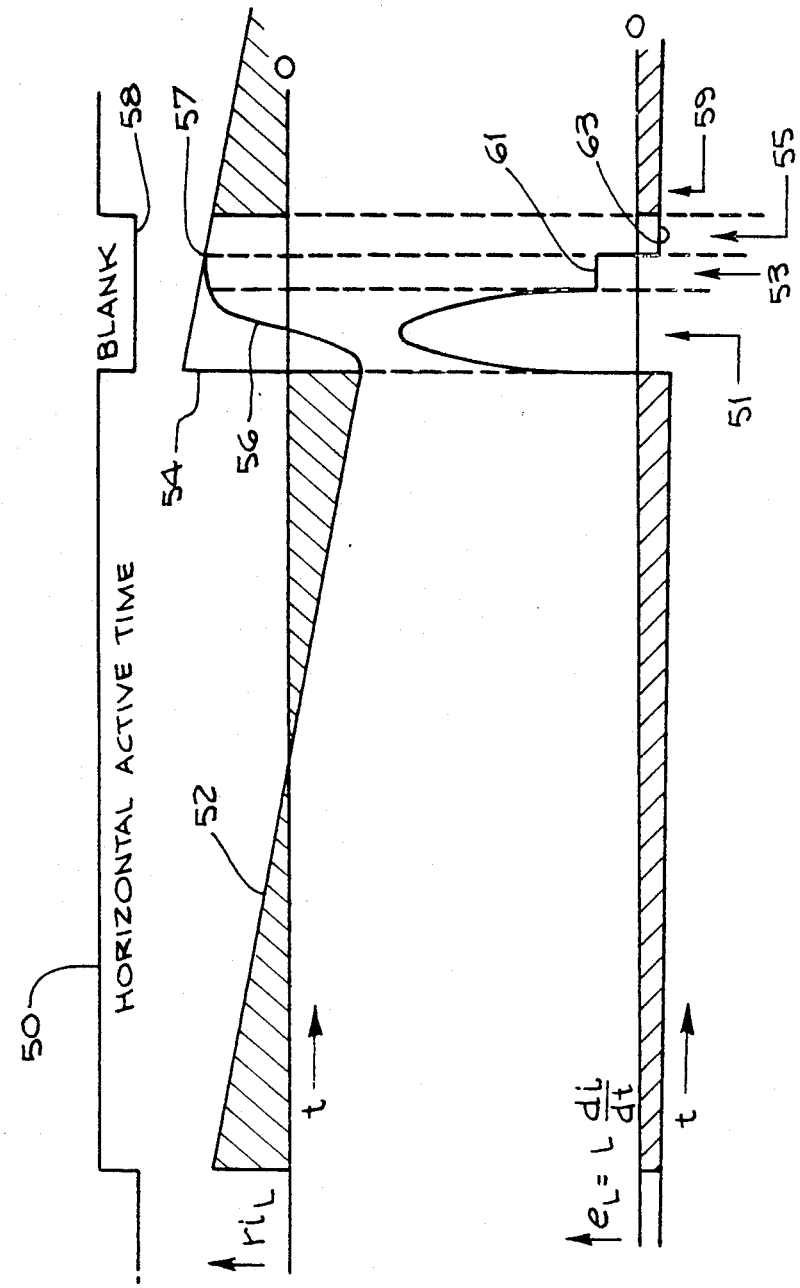

LINEAR DEFLECTION AMPLIFIER WITH ENERGY RECOVERY

BACKGROUND OF THE INVENTION

1. Field of the Invention

This invention relates to Linear Deflection Amplifiers for use in conjunction with cathode ray tube (CRT) displays for radar systems. More particularly, this invention relates to a linear deflection amplifier characterized by transadmittance, transimpedance feedback, and resonant flyback energy recovery for and controlling the magnetic deflection yoke used in a radar CRT display terminal.

2. Description of Related Art

The output display of many radar systems is a cathode ray tube (CRT) upon which information is displayed and measured. Various modes of displays are used. One form of presentation is a type-P display characterized by a PPI (Plan Position Indicator) which shows range and azimuth for a full 120°. The center of the CRT screen represents the location of the radar antenna. Radar information is commonly stored in a memory whose address represents range and azimuth (angle). The memory is loaded radially (constant azimuth) and sent out along an arc (constant range). This forms on the display a PPI (plan position indicator) display. A typical display is 120° forming a fan shaped display with raster lines along the arc.

PPI and other modes of radar displays are characterized by horizontal and vertical deflection circuits which control a CRT electron beam as it sweeps across the screen in accordance with a predetermined arc or raster scan pattern. The electron beam is deflected by a magnetic field created by currents passing through horizontal and vertical deflection yokes.

Retrace signals are produced by an external timing circuit.

The deflection circuits include two power amplifiers for driving two yokes, one for vertical and the other for horizontal deflection. Prior art deflection magnetic yoke amplifiers were characterized by an amplifier in a feedback circuit which saturated when a step input of sufficient magnitude was applied to the amplifier input, breaking the feedback loop. Small amplitude signals do not disturb the closed loop system. It was the closed loop amplifier response that established the visual display of the CRT, as well as linearity and general fidelity of the image.

Generally two types of inputs to the sweep circuits are most commonly encountered. These inputs are the small signal step input and the ramp. The small step input may be used to move the indicator beam small distances, while the ramp input is used to scan the beam across the CRT screen. One requirement for horizontal sweep amplification circuitry has been the need to provide retrace of the deflected signal, so that the indicator beam may return to its point of origin and begin the next scan across the screen. In the prior art, about a five micro-second settling time was imposed upon the deflection amplifier. Such predetermined settling response time allowed relatively slow amplifier systems to handle a five microsecond retrace when magnetic deflection was used. This is the case of a majority of television and radar monitors. This retrace capability was known as resonant flyback.

In the prior art, the linear amplifiers which amplified the horizontal sweep signal used the resonant frequency of the deflection yoke, a capacitor and a switch to achieve retrace and generate a fast reverse voltage when hit by a ramp voltage return. Resonant flyback caused the yoke to ring for one half cycle of resonant frequency and was independent of the amplifier bandwidth.

In the prior art, the amplifier was not linear during flyback, as it was during forward deflection. During flyback, the prior art amplifier designs were not suitable for beam positioning. The amplifiers were only useful to return the beam to the starting point during horizontal flyback time.

Prior art linear amplifiers for use in conjunction with a magnetic deflection yoke of a CRT system have been complex circuits and generally provided controlled deflection current by using bipolar transistors. These bipolar transistors were usually configured in an emitter-coupled complementary configuration (PNP and NPN). Cross-over distortion was often an undesirable but necessary result of this complementary circuit configuration. Cross-over distortion was high for small input signals. The relative distortion diminished as the input signal became larger. However, for very large signals, saturation of the complementary configured bipolar transistors occurred and distortion again rose sharply due to clipping of the signal. Cross-over distortion is common in bipolar complementary or class B stage configurations of linear amplifiers because the basic operation of such amplifiers requires one transistor to be turned "on" and operating during one half cycle, while the other transistor is turned "on" during the other half cycle. As the input sinusoidal or other waveform crosses the horizontal axis, distortion occurs because current flows in both transistors for a short period. The residual biasing of the class B configuration of the bipolar transistors leads to this distortion.

Furthermore, temperature compensation is needed in high power circuits where current is shuttled between complementary branches of an amplifier configuration. Heretofore, these problems of cross-over distortion and temperature compensation have not been directly addressed in deflection amplifier systems used to drive magnetic deflection yokes of a radar CRT system.

SUMMARY OF THE INVENTION

The subject invention discloses a linear deflection amplifier system for use in conjunction with a magnetic deflection CRT system which provide high resolution amplification of the sweep signal during active sweep time and smooth resonant flyback during the blanking period where the deflected beam returns to its point of origin.

The subject invention is characterized by a linear deflection amplifier system, for use in a magnetic deflection CRT. The deflection amplifier system comprises a deflection yoke which is driven by an amplifier means having a predetermined sweep signal input. A power stage means is connected to the amplifier means and provides a gain limited current source. The original input signal is amplified by the system, providing a current output within a range under that of amplifier saturation. The flyback switching means receives current from the power stage means. This limited current output source provides a current signal to the deflection yoke after passing through a flyback switching means.

The flyback switching means is uniquely positioned between the power stage means and the deflection yoke of the CRT display. The deflection yoke feeds back a controlling current to the amplifier means so that the output current follows the input voltage, with resulting transadmittance.

The flyback switching means of the subject invention is a normally closed switch which is driven open by a blanking signal at the end of the active period. The normally closed switch, when opened, cuts off the deflection yoke from the power stage. The deflection yoke is a high inductance component coupled in shunt with a capacitance. The yoke is known as an electrical energy storage element. When the deflection yoke is cut off from the power stage and amplifier means by opening the normally closed flyback switch, a shunt capacitor which is positioned about the normally closed switch receives current from the deflection yoke, causing the switch to go into resonant flyback during the blanking period.

The deflection yoke fully charges the shunt capacitor. Further along in the blanking period, the shunt capacitor discharges itself into the yoke. As the charge begins to leave the capacitor, it flows back to the deflection yoke. The flow of current through the diode (which is located within the FET switch) ends the flyback resonant cycle. The initial input amplifier stage detects an imbalance between its input signal and the output current passing through the deflection yoke. This imbalance leads to an error signal which is processed back through the power stage means and the flyback switch. More current begins to flow across the diode. The normally closed flyback switch then receives a signal which ends the blanking period and slowly recloses the switch. As soon as the initial operation amplifier causes the output current to again follow the input voltage, the current through the deflection yoke returns to its original position for beginning a new scan cycle.

The linear deflection amplifier of this invention includes the power stage means which comprises a unity gain amplifier coupled to a pair of complementary transistors. The transistors are configured in a class B amplifier configuration. Each transistor is coupled to a temperature compensating means. In this manner a current source is achieved having a low cross-over distortion. In the preferred embodiment, the complementary transistors are Power FETs (Field Effect Transistors) which are characterized by low cross-over distortion and high speed, high power switching ability. In the preferred embodiment, the temperature adjusting means, which is tied to the power FETs, may be a bipolar transistor having an adjustable current source means tied to its base. In the preferred embodiment, this current source means which drives the base of the temperature adjusting transistor may be controlled by a potentiometer.

Thus, a method is disclosed for providing linear, distortion-free, amplification to a magnetic deflection circuit of a radar CRT system where a horizontal sweep signal is amplified. A first amplified output signal is derived and is the function of the sweep signal input. This first amplified output signal is provided to a power stage means. This first amplified output signal is further amplified within predefined temperature and current ranges, the resulting output being a second output signal which acts as a current source. This second output signal is processed in series through a controlled switching means and deflection yoke. The deflection yoke provides a current output signal which is fed back to the initial input for combining and following the horizontal sweep signal input.

In a broad aspect of this invention, the deflection yoke receives controlled current from an amplifier system by way of a flyback switch. The flyback switch is positioned between the amplifier system and the deflection yoke. The switch includes a current directing device in order to regulate current through the deflection yoke. The amplifier system is driven by a sync circuit.

These features and other advantages of the present invention will become apparent from a consideration of the Detailed Description of the Invention when considered in conjunction with the accompanying Drawings.

BRIEF DESCRIPTION OF THE DRAWINGS

FIG. 3 is a graphic representation of the entire cycle of horizontal sweep and deflection as signals are processed through the linear deflection amplifier system; and further shows output voltage and inductor voltage, and the manner in which they relate to one another;

FIG. 5 is an operational schematic circuit diagram of the linear deflection amplifier with energy recovery of this invention, showing the locations A, B and C where the schematic of FIG. 5 links to components of the schematic of FIG. 4.

DETAILED DESCRIPTION OF THE INVENTION

Figure 1:
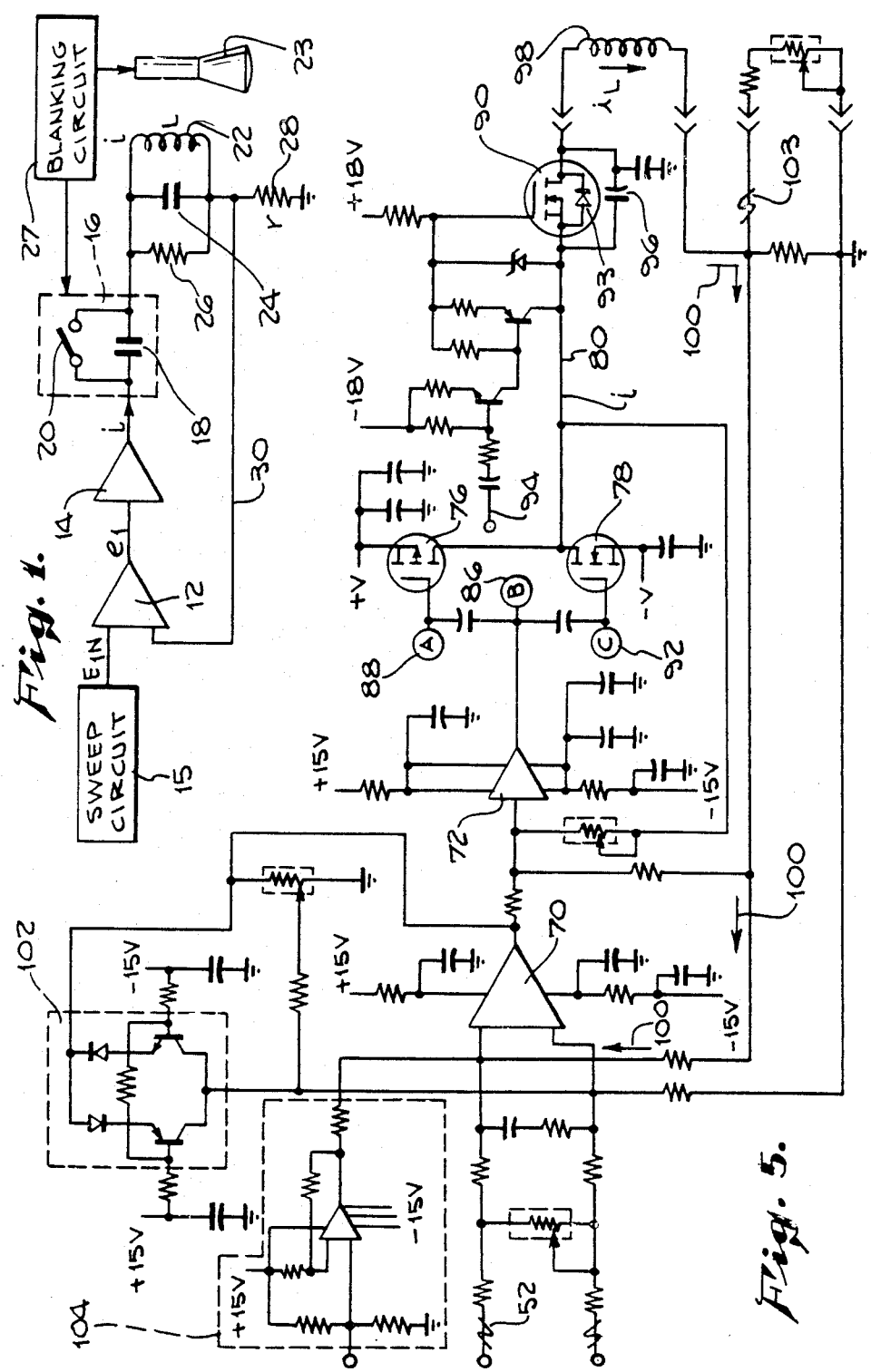
FIG. 1 is a generalized schematic architecture for the linear deflection amplifier with energy recovery illustrating the principles of this invention.

With reference to FIG. 1, the general architectural schematic of the linear deflection amplifier and flyback recovery system of this invention is shown. The purpose and function of this system is to provide linear amplification of the sweep signals of a radar CRT (Horizontal and Vertical in an Arc Raster Scan Screen) with smooth energy recovery and flyback of the scanning electron beam.

In the system shown in FIG. 1, an input voltage (Ein) derived from a sweep circuit 15, is processed to provide an output current ($i_L$). The input pre-amplifier stage is shown as a high gain, wide bandwidth, high frequency amplifier 12. This amplifier 12 is characterized by low output impedance. The output voltage ($e_1$) from amplifier 12 is provided to the input of the transadmittance amplifier 14. Amplifier 14 is the power stage of the system and provides current to the flyback control 16. The flyback control 16 is comprised of the capacitor 18 and electronic switch 20. Opening and closing of the flyback control 16 is directed by the blanking circuit 27. The switch 20 is easily and quickly opened to turn off; however, the flyback control 16 turns on slowly. In this manner, energy recover flyback is accomplished by the capacitor 18 acting across the switch 20.

With reference to FIGS. 1 and 3, during horizontal active time 50, current ($I_L$) passes through the inductive yoke 22 of the magnetic deflection system of this invention. The inductive yoke 22 controls the deflection pattern which an electron beam follows for providing a display on the Cathode Ray Tube (CRT) 23. The switch 20 is normally closed during the horizontal active time 50. During this active time 50, the horizontal sweep is amplified at the pre amplifier 12 and power stage amplifier 14. Horizontal sweep may vary linearly as shown at 52. The yoke 22 is part of a resonant system that includes an effective equivalent capacitor 24 and the equivalent damping resistance 26. Feedback of the output signal is provided along pathway 30 to the amplifier 12 to form a closed loop. The system shown in FIG. 1 may be characterized by a closed system response, where the corresponding Laplace Transform is a second order function as follows:

$$I_L/E_{in} = \frac{1}{r \cdot (L \cdot C \cdot S^2 + (L/R) \cdot S + 1)}$$

where:
$I_L$ = the yoke 22 current;
$E_{in}$ = the input voltage to amplifier 12;
r = the sense resistor 28;
L = the yoke 22 inductance;
C = the yoke 22 capacitance, symbolized by capacitor 24; and,
R = the equivalent damping resistance 26.
Response is determined by the yoke resonant frequency, is typically 2.5 MHZ.

By locating the flyback control 16 between the power stage and the load, a novel circuit configuration is achieved. FIG. 3 shows that during horizontal active time 50, the output current follows the input voltage (Ein). During the blanking period 58, as the ramp input voltage 54 returns, the resonant flyback operates to allow the output voltage 56 to quickly recover and follow the input voltage at 57. The yoke 22 (FIG. 1) rings for a one-half cycle, the first half 51 of the blanking period 58. During this half cycle 51, the output current 56 ($I_L$) does not coincide with the input voltage 54. During the blanking period 58, only from point 57 forward in time, do voltages 54 and 56 coincide.

The flyback switch 16 of FIG. 1 is normally turned "on" and closed during the horizontal active time 50. During the ringing portion or first half 51 of the blanking period 58, the switch is turned off, and the yoke 22 charges up the capacitor 18. At the end of the first half 51, the switch 16 is turned on, holding the positive voltage level 61 for ($e_L$) for a quarter (53) of the blanking period 58. The voltage level is allowed to drop off in the fourth quarter (55) to a stabilizing level 63 so that active sweep 59 may commence.

Thus, the blanking period 58, during which time resonant flyback occurs, is to be considered as divided into three segments, namely: flyback 51 (first half), correction third quarter 53); and, stable (fourth quarter 55). It is during this blanking period 58 that the scanning beam sweeps back to the start of the next raster line. A unique feature of the architecture shown in FIG. 1 is that the flyback switch 16 is part of a transimpedance feedback loop. The goal of the system is to assure a smooth current source ($i_L$) which follows the input voltage ($e_{in}$).

Figure 2:
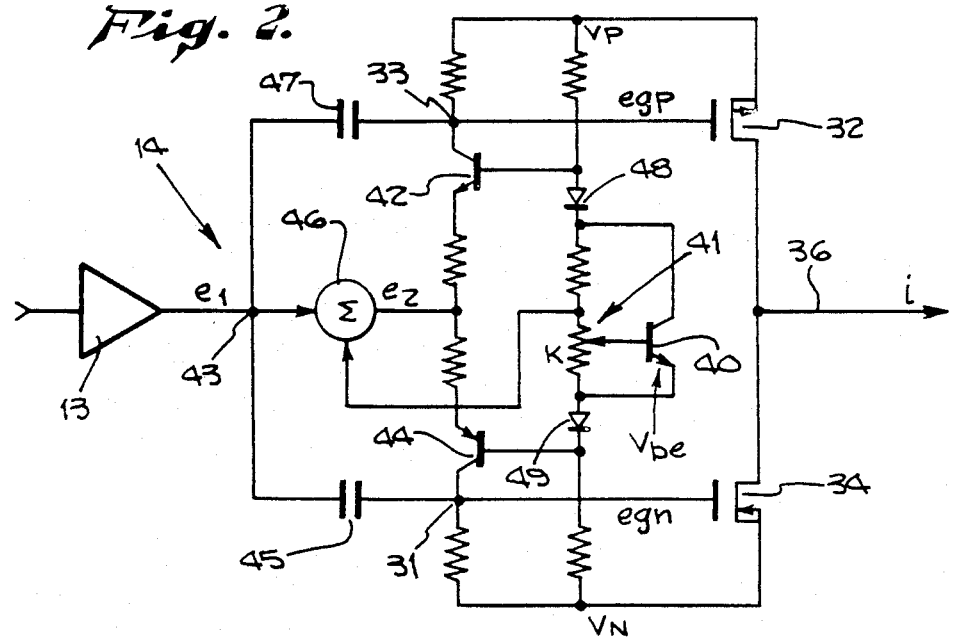
FIG. 2 is a detailed circuit diagram of the power stage 14 of FIG. 1.

"Transimpedance feedback" is characteristic of a network which samples the output current and provides an input voltage. Such a network has high input and output impedance, and its gain is a function of the reciprocal impedance, or admittance. This transimpedance feedback which is characteristic of the system is achieved, in part, due to the unique configuration of the power stage, shown in FIG. 2. The transimpedance feedback provides a transadmittance operation for this circuit and its associated preamplifier 12. The power stage of FIG. 2 is shown generally at 14. The linear unity gain amplifier 13 feeds a voltage el to the node 43 for distribution to a summing circuit 46 and for alternatively driving the gates of FET 32 and FEI 34.

The power stage amplifier 14 of FIG. 2 includes a pair of complimentary power FETS 32 and 34 which are arranged in a modified Class B configuration. These two devices (FETs 32 and 34) are used to deliver power to the flyback control 16 and yoke 22. Each device is operating alternatively in half cycles of the input voltage $e_1$. This power stage acts as a transadmittance amplifier with (transconductance) $g_m$ typically equal to −0.8 mho. The resulting output is a current source (i) to the load.

The FET 32 may be a PMOS power transistor whose gate is driven with a voltage $e_{gp}$, where, $$e_{gp} = V_p + e_2 - Kv_{be}.$$

Likewise, FET 34 is complementary to FET 32 and is preferably an NMOS power transistor, whose gate is driven with a voltage $e_{gn}$, where, $$e_{gn} = V_n + e + Kv_{be}.$$

DC gain ($e_{gp}/e_2$) and ($e_{gn}/e_2$) is maintained at unity through the series network of resistors and transistors 42 and 44 which are connected between Vp and Vn. Each of the resistors along this network are equally rated. This network generally, conducts and provides DC bias at nodes 31 and 33 to the NMOS FET 34 and PMOS FET 32, respectively. AC coupling to the gates of FETs 32 and 34 is provided by capacitors 47 and 45. These capacitors 47 and 45 are equally rated, thereby providing a low impedance drive to the gates of FETs 32 and 34.

Diodes 48 and 49 are generally "on" and act to provide drive to the bases of transistors 42 and 44. Positioned between these diodes 48 and 49 is a temperature compensating transistor 40 which is shunted to a potentiometer 41. Current to the base of transistor 40 is controlled by adjustment of the potentiometer (POT) 41. The POT 41 is adjusted during circuit testing to control the voltage (Vbe) across the base-emitter junction of the transistor 40. The transistor 40 is thereby rendered "adjustable" in terms of the current control and provides temperature compensation for the FETs 32 and 34, because it is in thermal contact with them.

During operating, the FETs 32 and 34 exhibit low cross-over distortion, in contrast to prior art bipolar transistors in a "push-pull" class B configuration. However, the enhancement mode PMOS FET 32 and NMOS FET 34 do exhibit temperature characteristics. In order to provide a constant low bias current, a temperature compensating transistor 40 is used to vary gate voltages egb and egn of the FETs 32 and 34 to prevent thermal runaway of the power stage amplifier 14.

Figure 4:
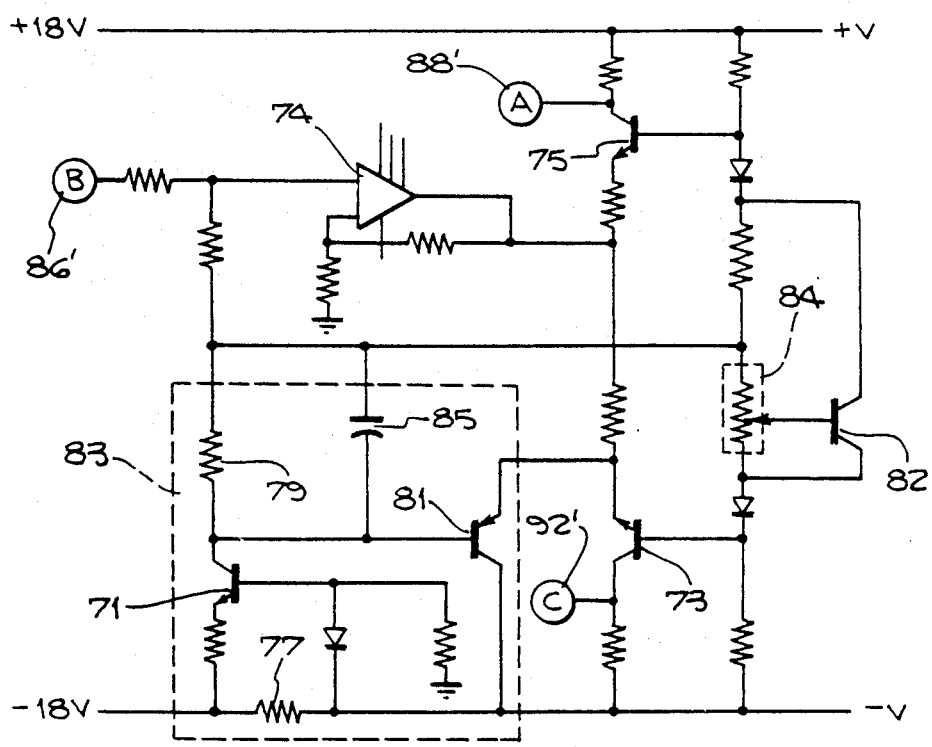
FIG. 4 is an operational schematic circuit diagram of a portion of the power stage of this invention, which is connected to the circuit shown in FIG. 5 at indicated locations A, B and C.

With reference to FIG. 4 and FIG. 5, a preferred operational embodiment of the linear deflection amplifier system of this invention is shown. A horizontal sweep signal 52 is provided to the non-inverting input of the operational amplifier 70. As previously discussed, the horizontal sweep is used to drive a yoke 98 in a magnetic deflection CRT system providing a horizontal scan for the radar indicator screen. The output signal from the amplifier 70 is fed forward to a unity gain amplifier 72, which is the first stage of the power and transadmittance amplifier (14 of FIG. 1). The output of amplifier 70 is also fed back to a non-saturating limiter circuit 102 to assure that the output of the amplifier 70 does not cause saturation which could lead to instability. The sweep signal at the non-inverting input of amplifier 70 is centered by the horizontal center circuit 104, which operates in a known fashion to center the horizontal sweep of the electron beam across the CRT screen.

The output of the unity gain amplifier 72 is provided from 86 of FIG. 5 to the non-inverting input 86' of summing amplifier 74 (FIG. 4). The output of amplifier 74 is fed back to its inverting input and fed forward to the series circuit linking V+ and V−(+/−18 volts typically) between complementary bipolar transistors 73 and 75. These transistors function is a manner similar to transistors 42 and 44 of FIG. 2 and are used to provide a DC signal to the gates of P MOS FET 76 and N MOS FET 78 by way of the connections 88'−88 and 92'−92, respectively. Temperature compensation of the driving current and FETs 76 and 78 is accomplished by operation of temperature compensating transistor 82.

The POT 84 adjustably controls the current drive to the base of transistor 82, in a manner heretofore described with regard to FIG. 2. A current limiting function is provided by network 83 (FIG. 4) to limit the range of current through FET 78 in case of thermal runaway.

The current through the resistor 77 of FIG. 4 us sensed and amplified by the transistor 71 and provides an amplified voltage (across the resistor 79 and the capacitor 85) which operates the transistor 81 to limit the average current through the transistor 73 and therefore also through the MOSFET 78. Current limiting occurs only to protect the MOSFETS in case some circuit failure causes thermal runaway.

During horizontal active time 50 (FIG. 3), the current (i) follows the input voltage sweep signal to amplifier 70, as shown by the "bow-tie" configuration of the output signal 52 (FIG. 3). A positive stretched pulse 50 lasting at least 50 micro-seconds is applied to the blanking trigger input 94 during horizontal active time. This pulse is applied to the gate of the N MOS (N —Metal oxide semiconductor field effect transistor) FET 90. FET 90 is a normally closed switch. The current signal $i_L$ is inverted and fed back along signal pathway 100 to the non-inverting input of amplifier 70. Assuming that the output signal 103 follows the input voltage 52, there is no error signal output from amplifier 70. As described before, during this active period, the output current follows input voltage; and, $e_{in}$ and $ri_L$ are superimposed during the active period 52.

The FET switch 90 is designed to turn "off" quickly and "on" slowly. The source to drain junction is connected by an internal diode 93 across the FET switch 90. With slow turn-on there is a transition time when the diode is still conducting and the MOSFET switch is turned on, providing a smooth transition from positive to negative current flow.

As discussed before, the 8–10 microsecond blanking period 58 (FIG. 3) may be subdivided into a first half of resonant flyback, followed by a third quadrant 53 of correction and fourth quadrant 55 of stable signal.

Resonant flyback commences by turning off FET switch 90. In the first part of resonant flyback, the inductor yoke 98 is cut off from current along pathway 90 by the opening of FET switch 90. The current then flows through capacitor 96. However, once the capacitor 96 is fully charged, it discharges in an opposite direction through the yoke 98. When the flyback voltage reaches level 61, then diode 93 conducts, and continues conducting until the current 52 ($i_L$) crosses zero, halfway in the horizontal active time 50. Also, since the output voltage 56 does not follow the input voltage 54 (FIG. 3) during the first portion of the blanking period 58, the operational amplifier 70 produces an error output signal to correct (53) the lag between input and output. Once this correction is made at point 57 of FIG. 3 the slope of the output voltage 56 begins to drop and follow the input, causing the inductor voltage (L) to drop and stabilize (55 of FIG. 3). The output signal catches up (at 57) with and follows the input 52 to begin the next active horizontal sweep period.

In this manner, a closed loop system is presented which is responsive to the active sweep signal and the need to quickly flyback to begin the next sweep. While a preferred embodiment has been disclosed herein, it is intended that the invention as claimed not be limited to this preferred embodiment disclosed. For example, the disclosure equally applies to a vertical deflection circuit for driving a CRT yoke. Therefore, the appended claims are to be broadly construed to claim alternative embodiments to those disclosed without departing from the scope of the invention.

What is claimed is:

1. A linear deflection amplifier system, for use in a magnetic deflection CRT, comprising:
   a deflection yoke;
   amplifier means for receiving a predetermined sweep signal;
   power stage means for providing a limited current source, with a dc voltage gain maintained at unity, connected to said amplifier means, wherein said power stage means comprises:
   a unity gain amplifier coupled to a first pair of complementary transistors,
   said first pair of transistors configured as a Class B amplifier and each of said first pair of transistors coupled to an adjustable temperature compensating means,
   a summing amplifier coupled to the output of said unity gain amplifier,
   a series circuit linking a second pair of complementary transistors, said series circuit coupled to said summing amplifier and providing a dc signal to said first pair of complementary transistors, and
   a current limiting circuit means coupled to said series circuit for limiting the average current through one of said second pair of complementary transistors,
   wherein a current source is achieved having low cross-over distortion;
   flyback switching means connected to receive current from said power stage means, said flyback switching means positioned between said power stage means and said deflection yoke;
   said deflection yoke connected to receive current from said power stage means through said flyback switching means; and
   means for feeding back a controlling current signal from said deflection yoke to said amplifier means.

2. The linear deflection amplifier of claim 1, wherein:
   said flyback switching means comprises:
   a normally closed switch which is driven open by a blanking signal;
   said normally closed switch, when opened, cutting off said deflection yoke from said power stage;

a shunt capacitor connected across said normally closed switch;

said shunt capacitor receiving current from said deflection yoke when said switch is opened;

whereby, resonant flyback occurs until the switch again is driven to conduct.

3. The linear deflection amplifier of claim 1 or 2, wherein said complimentary transistors are power FETs.

4. The linear deflection amplifier of claim 1 or 2, wherein the temperature adjusting means is bipolar transistor with an adjustable current source means tied to its base.

5. A linear deflection amplifier system, for use in an output deflection sweep control circuit, comprising:

a deflection yoke for driving a CRT electron beam across a CRT viewing screen;

preamplifier means for amplifying a pre-determined sweep signal;

a unity gain amplifier connected to said preamplifier for amplifying output from said preamplifier means;

said unity gain amplifier including a current limiting network and a temperature compensating adjustable controller;

the unity gain amplifier providing a unity gain output signal to a pair of complementary configured field-effect transistors;

said field-effect transistors providing a controlled current output signal;

a resonant flyback switching circuit for receiving said controlled current output signal, said flyback switching circuit acting to control the switching of current to said deflection yoke;

said flyback switching circuit positioned between said yoke and said field-effect transistors;

said flyback switching circuit including a MOSFET transistor with a diode connecting a source to a drain of said transistor for use during resonant flyback; and a capacitor coupled in shunt with said MOSFET;

whereby, flyback switching may be used to provide smooth resonant flyback between sweep cycles of said deflection yoke.

* * * * *